US009837588B2

(12) United States Patent
Joo et al.

(10) Patent No.: US 9,837,588 B2
(45) Date of Patent: Dec. 5, 2017

(54) LIGHT-EMITTING DEVICE PACKAGE AND LIGHTING APPARATUS INCLUDING THE PACKAGE

(71) Applicant: LG INNOTEK CO., LTD., Seoul (KR)

(72) Inventors: Yang Hyun Joo, Seoul (KR); Sang Jun Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/008,659

(22) Filed: Jan. 28, 2016

(65) Prior Publication Data
US 2016/0233397 A1 Aug. 11, 2016

(30) Foreign Application Priority Data

Feb. 6, 2015 (KR) .................. 10-2015-0018417

(51) Int. Cl.
*H01L 33/58* (2010.01)
*H01L 33/50* (2010.01)

(52) U.S. Cl.
CPC .............. *H01L 33/58* (2013.01); *H01L 33/50* (2013.01); *H01L 2224/49107* (2013.01)

(58) Field of Classification Search
None
See application file for complete search history.

(56) References Cited

U.S. PATENT DOCUMENTS

| 2003/0185526 | A1* | 10/2003 | Hohn | H01L 31/0203 385/93 |
| 2006/0078246 | A1* | 4/2006 | Ashida | G02B 3/0031 385/14 |
| 2007/0284607 | A1* | 12/2007 | Epler | H01L 33/16 257/103 |
| 2008/0007966 | A1* | 1/2008 | Ohkawa | G02B 5/045 362/608 |
| 2010/0006885 | A1* | 1/2010 | Gong | H01L 33/38 257/99 |
| 2011/0291131 | A1* | 12/2011 | Ito | H01L 33/54 257/93 |
| 2013/0208487 | A1* | 8/2013 | Hsieh | F21V 13/04 362/310 |
| 2014/0300972 | A1* | 10/2014 | Sasaki | G02B 3/0031 359/642 |

FOREIGN PATENT DOCUMENTS

CN 202487663 U * 10/2012

* cited by examiner

*Primary Examiner* — Angel Roman
*Assistant Examiner* — Kevin Quinto
(74) *Attorney, Agent, or Firm* — KED & Associates, LLP

(57) ABSTRACT

A light-emitting device package and a lighting apparatus including the light-emitting device package are provided. The light-emitting device package may include a body, a light-emitting device provided on the body, a phosphor layer provided on the body and the light-emitting device, and a lens provided on the phosphor layer that refracts and reflects light discharged from the light-emitting device and having a lens body. The lens body may include a side portion, a recess having a curved surface and provided at a center of an upper surface of the lens body, and an edge portion having a convex rounded shape and provided between the recess and the side portion.

17 Claims, 7 Drawing Sheets

LIGHT-EMITTING DEVICE PACKAGE AND LIGHTING APPARATUS INCLUDING THE PACKAGE

CROSS REFERENCE TO RELATED APPLICATION

This application claims priority under 35 U.S.C. §119 to Korean Application No. 10-2015-0018417 filed on Feb. 6, 2015, whose entire disclosure is incorporated herein by reference.

TECHNICAL FIELD

Embodiments relate to a light-emitting device package and a lighting apparatus including the light-emitting device package.

BACKGROUND

Light-emitting Diodes (LEDs) are semiconductor devices that convert electricity into light using characteristics of compound semiconductors so as to enable transmission and reception of signals and that are used as a light source. Group III-V nitride semiconductors are highlighted as core materials of light-emitting devices, such as, e.g., LEDs or Laser Diodes (LDs) due to physical and chemical characteristics thereof. Such LEDs do not include environmentally harmful materials, for example, mercury (Hg), used in lighting appliances such as, e.g., fluorescent lamps and incandescent bulbs. Thus, LEDs are very eco-friendly and have several advantages such as, for example, long lifespans and low power consumption.

Current light sources are being rapidly replaced with LEDs. Pricing of current lighting apparatuses using light-emitting device packages, including the light-emitting device described above, and a lens provided thereon is getting more competitive. In order to reduce the price of lighting apparatuses, light-emitting device packages may need to exhibit high efficiency and have a wide viewing angle. However, recent light-emitting device packages may refract light disadvantageously and cause color deviation and luminance deviation, as well as may reflect light disadvantageously and have a narrow light distribution area.

BRIEF DESCRIPTION OF THE DRAWINGS

The embodiments will be described in detail with reference to the following drawings in which like reference numerals refer to like elements wherein.

DETAILED DESCRIPTION

Figure 1:
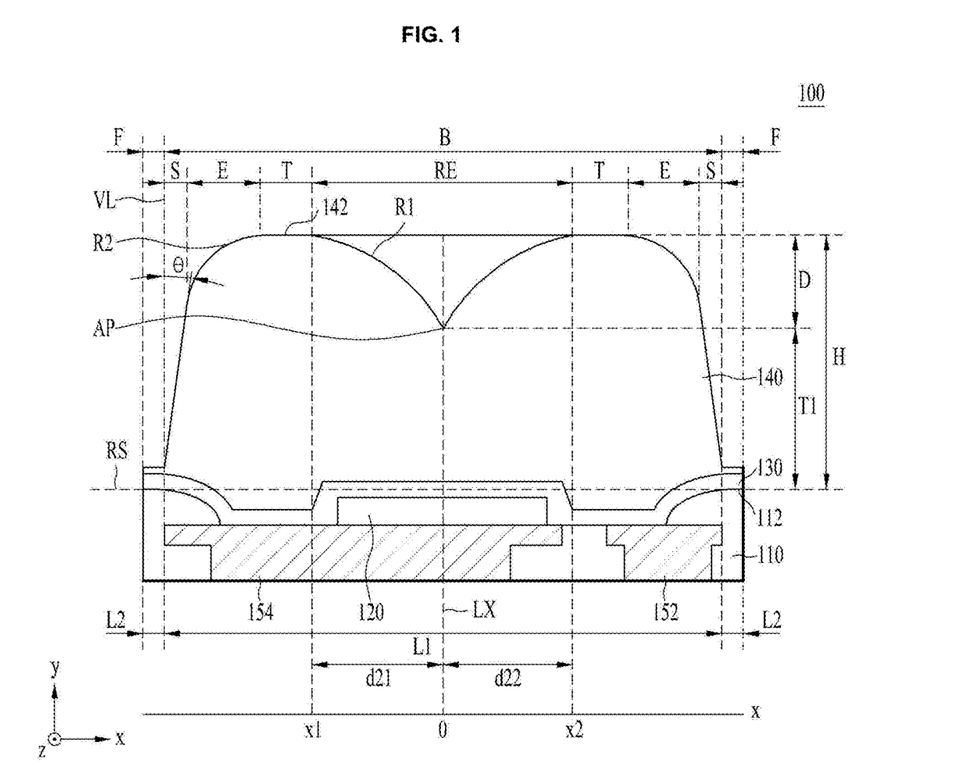
FIG. 1 is a sectional view of a light-emitting device package in accordance with an embodiment.

FIG. 1 is a sectional view of a light-emitting device package 100 in accordance with an embodiment. The light-emitting device package 100 illustrated in FIG. 1 may include a body 110, a light-emitting device 120, a phosphor layer or fluorescent substance layer 130, and a lens 140. The body 110 may be formed of silicon, a synthetic resin, or a metal.

The light-emitting device package 100 may further include first and second lead frames 152 and 154. The first and second lead frames 152 and 154 may be spaced apart from each other in a width direction of the lens 140, for example, along the x-axis. The first and second lead frames 152 and 154 may be electrically separated from each other and may serve to provide the light-emitting device 120 with power. The first and second lead frames 152 and 154 may serve to reflect light generated in the light-emitting device 120 so as to increase luminous efficacy, and may also serve to discharge heat generated in the light-emitting device 120 outward.

The light-emitting device 120 may be mounted on the body 110. Although the light-emitting device 120 may have one of a vertical bonding structure, a horizontal bonding structure, or a flip-chip type bonding structure, the embodiment is not limited as to the bonding structure of the light-emitting device 120.

The light-emitting device 120 may include a first conductive semiconductor layer, an active layer, and a second conductive semiconductor layer, regardless of the bonding structure of the light-emitting device 120. In addition, the light-emitting device 120 may be utilized in a light-emitting diode and may include at least one of a colored light-emitting diode that emits colored light, such as, e.g., red light, green light, blue light or white light, or an Ultraviolet light-emitting diode that emits UV light.

Figure 2:
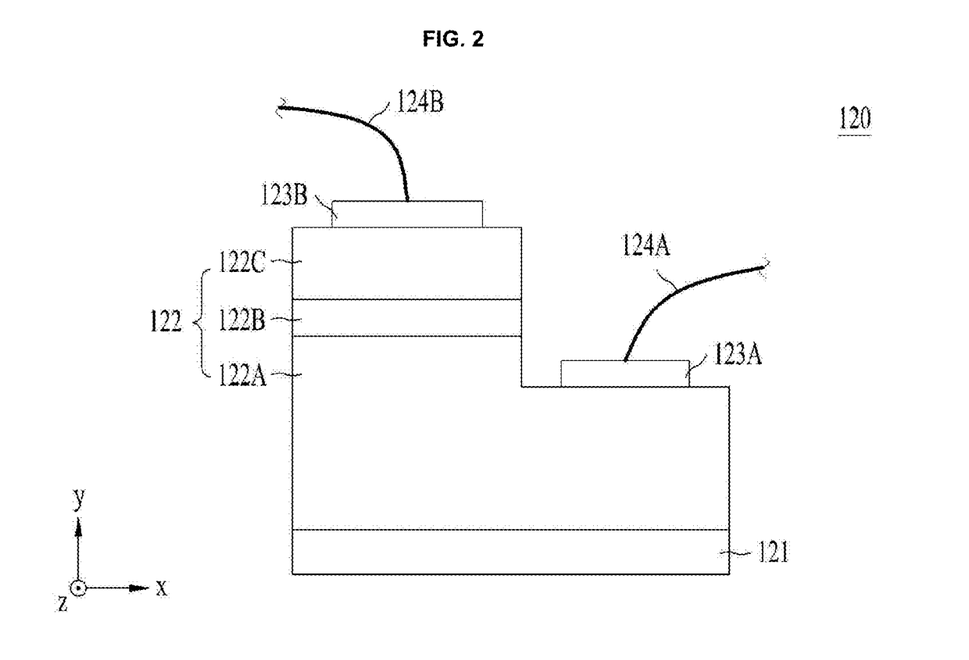
FIG. 2 is a sectional view of the light-emitting device illustrated in FIG. 1.

FIG. 2 is a sectional view of the light-emitting device 120 illustrated in FIG. 1. The light-emitting device 120 illustrated in FIG. 2 may have a horizontal bonding structure. The light-emitting device 120 may include a substrate 121, a light-emitting structure 122, and first and second electrodes 123A and 123B. The substrate 121 may include a conductive or non-conductive material. For example, the substrate 121 may include at least one of sapphire ($Al_2O_3$), GaN, SiC, ZnO, GaP, InP, $Ga_2O_3$, GaAs, or Si.

The light-emitting structure 122 may include a first conductive semiconductor layer 122A, an active layer 122B, and a second conductive semiconductor layer 122C, which may be sequentially stacked on the substrate 121. The first conductive semiconductor layer 122A may be provided on the substrate 121, and may be formed of, for example, a group III-V or II-VI compound semiconductor, which may be doped with a first conductive dopant. When the first conductive semiconductor layer 122A is an n-type semiconductor layer, the first conductive dopant may be an n-type dopant and may include Si, Ge, Sn, Se, or Te, without being limited thereto.

For example, the first conductive semiconductor layer 122A may include a semiconductor material having a composition of $Al_xIn_yGa_{(1-x-y)}N$ ( $0 \le x \le 1, 0 \le y \le 1, 0 \le x+y \le 1$). The first conductive semiconductor layer 122A may include any one or more of GaN, InN, AlN, InGaN, AlGaN, InAl-GaN, AlInN, AlGaAs, InGaAs, AlInGaAs, GaP, AlGaP, InGaP, AlInGaP, and InP.

The active layer 122B may be provided between the first conductive semiconductor layer 122A and the second conductive semiconductor layer 122C. The active layer 122B may be a layer in which electrons or holes injected through the first conductive semiconductor layer 122A and holes or electrons injected through the second conductive semiconductor layer 122C meet to emit light having energy determined by an inherent energy band of a constituent material of the active layer 122B. The active layer 122B may be formed into at least one structure selected from among a single-well structure, a multi-well structure, a single-quantum well structure, a multi-quantum well structure, a quantum dot structure, or a quantum wire structure. The active layer 122B may include a well layer and a barrier layer having a pair structure of any one or more of InGaN/GaN, InGaN/InGaN, GaN/AlGaN, InAlGaN/GaN, GaAs(In-GaAs)/AlGaAs, and GaP(InGaP)/AlGaP, without being limited thereto. The well layer may be formed of a material having lower band gap energy than the band gap energy of the barrier layer.

A conductive clad layer may be formed above and/or under the active layer 122B. The conductive clad layer may be formed of semiconductors having higher band gap energy than the band gap energy of the barrier layer of the active layer 122B. For example, the conductive clad layer may include GaN, AlGaN, InAlGaN, or an ultra lattice structure. In addition, the conductive clad layer may be doped with an n-type or p-type dopant.

The second conductive semiconductor layer 122C may be provided on the active layer 122B and may be formed of a semiconductor compound. The second conductive semiconductor layer 122C may be formed of, for example, group III-V or II-VI compound semiconductors. For example, the second conductive semiconductor layer 122C may include a semiconductor material having a composition of $In_xAl_yGa_{1-x-y}N$ (Oynconductor material havThe second conductive semiconductor layer 122C may be doped with a second conductive dopant. When the second conductive semiconductor layer 122C is a p-type semiconductor layer, the second conductive dopant may be a p-type dopant and may include, for example, Mg, Zn, Ca, Sr, or Ba.

The first conductive semiconductor layer 122A may be an n-type semiconductor layer, and the second conductive semiconductor layer 122C may be a p-type semiconductor layer. Alternatively, the first conductive semiconductor layer 122A may be a p-type semiconductor layer, and the second conductive semiconductor layer 122C may be an n-type semiconductor layer. The light-emitting structure 122 may be one of a structure selected from among an n-p junction structure, a p-n junction structure, an n-p-n junction structure, and a p-n-p junction structure.

Each of the first and second electrodes 123A and 123B may be formed of, for example, at least one of aluminum (Al), titanium (Ti), chrome (Cr), nickel (Ni), copper (Cu), or gold (Au), and may be formed into a single layer or multi-layer structure.

The first electrode 123A may be electrically connected to the first lead frame 152 via a first wire 124A, and the second electrode 123B may be electrically connected to the second lead frame 154 via a second wire 124B.

Although the light-emitting device 120 is illustrated in FIG. 1 as being provided on the second lead frame 154, the embodiment is not limited thereto. That is, the light-emitting device 120 may be provided on the first lead frame 152, may be formed over the first and second lead frames 152 and 154, or may be provided on the body 110. In addition, a horizontal length and a vertical length of the light-emitting device 120 may differ from each other or may be the same. The horizontal length of the light-emitting device 120 may refer to a length along the x-axis perpendicular to an optical axis LX, for example, the y-axis, and the vertical length of the light-emitting device 120 may refer to a length along the z-axis perpendicular to the optical axis LX. Alternatively, the horizontal length of the light-emitting device 120 may refer to a length along the z-axis perpendicular to the optical axis LX, and the vertical length of the light-emitting device 120 may refer to a length along the x-axis perpendicular to the optical axis LX.

Referring to FIG. 1, a phosphor layer 130 may be provided above the body 110 and the light-emitting device 120. For example, the phosphor layer 130 may be provided over an entire upper surface of the body 110 and over an upper surface and a side surface of the light-emitting device 120. The phosphor layer 130 may be uniform. That is, the thickness of the phosphor layer 130 may be even over the body 110, and on the upper surface and the side surface of the light-emitting device 120.

In addition, a planar area of the lens 140 in a direction perpendicular to the optical axis LX, for example, the x-axis or the y-axis, may be the same as the planar area of the phosphor layer 130. The phosphor layer 130 may include phosphors or a phosphorous material, and the phosphors may change the wavelength of light emitted from the light-emitting device 120. Although the phosphors may be selected from among YAG-based, TAG-based, silicate-based, sulfide-based, and nitride-based wavelength change materials, which may change light generated from the light-emitting device 120 into white light, the embodiment is not limited as to kinds of phosphors.

The YGA-based and TAG-based phosphors may be selected from among $(Y, Tb, Lu, Sc, Gd, Sm)_3(Al, Ga, In, Si, Fe)_5(O, S)_{12}$:Ce, and the silicate-based phosphors may be selected from among $(Sr, Ba, Ca, Mg)_2SiO_4$:(Eu, F, Cl). In addition, the sulfide-based phosphors may be selected from among (Ca, Sr)S:Eu, $(Sr, Ca, Ba)(Al, Ga)_2S_4$:Eu, and the nitride-based phosphors may be selected from among (Sr, Ca, Si, Al, O)N:Eu, for example, $CaAlSiN_4$:Eu β-SiAlON: Eu, or Ca-α SiAlON:Eu-based $(Ca_x, M_y)(Si, Al)_{12}(O, N)_{16}$, where M is at least one of Eu, Tb, Yb, or Er, 0.05<(x+y)<0.3, 0.02<x<0.27, and 0.03<y<0.3. Red phosphors may be nitride-based phosphors including N, for example, $CaAlSiN_3$:Eu. Nitride-based red phosphors may have higher reliability in resistance to external environments, such as, for example, heat and moisture, and a lower discoloration risk compared to sulfide-based phosphors.

The lens 140 may be provided on the phosphor layer 130, and may refract and reflect light discharged from the light-emitting device 120 so as to emit the light outward. The lens 140 may include a body B and a protrusion or a flange F. The body may include a side portion S, a recess RE, a top portion T, and an edge portion E.

The recess RE may be located in a center of an upper surface of the body B. That is, a lowermost apex AP of the recess RE may be located at the optical axis LX. The recess RE may be symmetrical about the optical axis LX. That is, the recess RE may have a symmetrical cross-sectional shape in at least one direction of the x-axis or the z-axis about the optical axis LX. A plan shape of the recess RE may also be symmetrical about the optical axis LX. In addition, the recess RE may include a curved surface or a flat surface.

The side portion S may be inclined in relation to a vertical line VL that may be parallel to the optical axis LX, or may be formed parallel to the vertical line VL. The top portion T may be located between the edge portion E and the recess RE and may be omitted as occasion demands, Although the edge portion E may be located between the top portion T and the side portion S, the embodiment is not limited thereto. When the top portion T is omitted, the edge portion E may be located between the recess RE and the side portion S. Although the edge portion E may have a convex rounded cross-sectional shape, the embodiment is not limited as to the cross-sectional shape of the edge portion E.

The protrusion F may protrude from the side portion S of the body B in a direction, for example, along at least one of the x-axis or the z-axis) perpendicular to the optical axis LX. Although the lens 140 may be thinnest at the optical axis LX, the embodiment is not limited thereto. A thickness of the lens 140 at the optical axis LX may correspond to a distance between the lowermost apex AP of the recess RE of the lens 140 and the phosphor layer 130.

The light-emitting device package 100 in accordance with the above-described embodiments may be applied to various fields. For example, the light-emitting device package 100 may be applied to lighting apparatuses such as, e.g., a backlight unit, a lighting unit, an indicator device, a lamp, and a street light.

Figure 3:
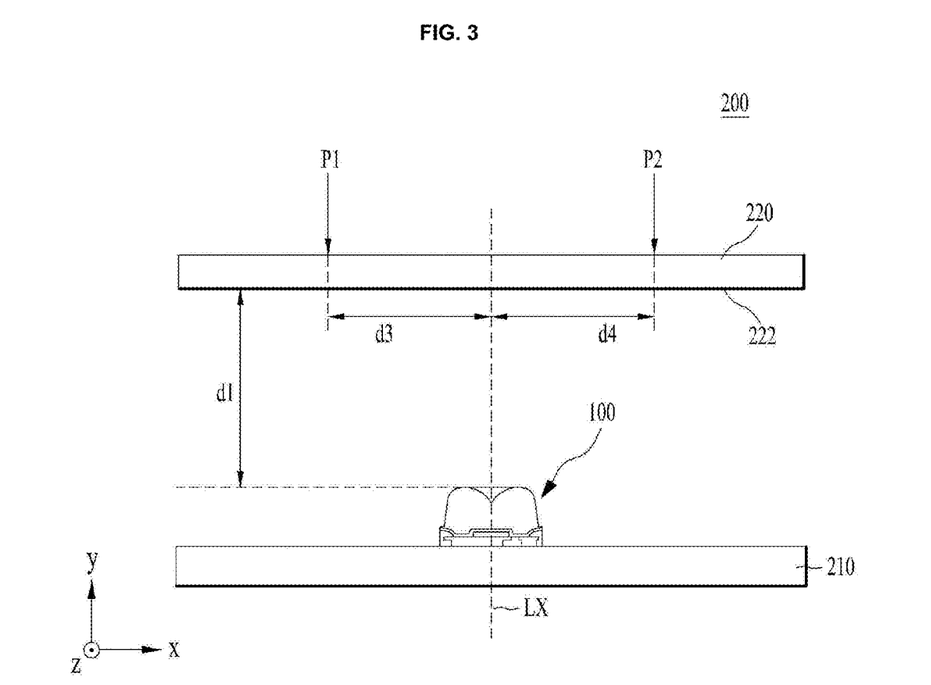
FIG. 3 is a sectional view of a lighting apparatus in accordance with an embodiment.

FIG. 3 is a sectional view of a lighting apparatus 200 in accordance with an embodiment. The lighting apparatus 200 illustrated in FIG. 3 may include the light-emitting device package 100, a circuit board 210, and an optical member 220. The light-emitting device package 100 may be the light-emitting device package 100 illustrated in FIG. 1, and thus, designated by the same reference numeral, and a repeated description thereof has been omitted.

The light-emitting device package 100 may be mounted on the circuit board 210. The circuit board 210 may be formed with an electrode pattern, which may interconnect an adaptor that supplies power and the light-emitting device package 100. For example, a carbon nano-tube electrode pattern may be formed on an upper surface of the circuit board 210 to interconnect the light-emitting device package 100 and the adaptor.

The circuit board 210 may be a Printed Circuit Board (PCB), which may be formed of, for example, polyethylene terephthalate (PET), glass, polycarbonate (PC), or silicon (Si). The circuit board 210 may be provided with a plurality of light-emitting device packages 100 and may be formed in a film shape. In addition, the circuit board 210 may be selected from among, for example, a single layer PCB, a multilayer PCB, a ceramic board, or a metal core PCB.

The optical member 220 may be provided above the light-emitting device package 100. The optical member 220 may be spaced apart from the light-emitting device package 100 by a first prescribed distance d1 The first prescribed distance dl may be defined as a distance from a lower surface 222 of the optical member 220 to an upper surface of the light-emitting device package 100. A space between the optical member 220 and the circuit board 210 may be filled with air, or may be filled with a light guide plate. When the space between the optical member 220 and the circuit board 210 is filled with air, the first prescribed distance d1 may be referred to as an air gap.

The optical member 220 may be formed into a single layer or multiple layers, and may be provided with a convex and concave pattern on an uppermost layer or on a surface of any one layer. The convex and concave pattern may be in strips arranged along the light-emitting device package 100. As occasion demands, the optical member 220 may be formed of at least one sheet, The optical member 220 may selectively include, for example, a diffusion sheet, a prism sheet, and a brightness reinforcement sheet. The diffusion sheet may serve to diffuse light emitted from the light-emitting device package 100, and may be formed with a convex and concave pattern on an upper surface thereof in order to increase diffusion effects. The prism sheet may guide diffused light to an emission area. The luminance diffusion sheet may increase luminance.

In a Comparative Example of a election-type light-emitting device package, light emitted from a light-emitting device may be reflected by a lens and be emitted in a direction perpendicular to an optical axis. In a Comparative Example of a refraction-type light-emitting device package, light emitted from a light-emitting device may be refracted by a lens and be emitted to a top portion or a side portion of the lens. In the Comparative Examples, the reflection-type light-emitting device package may have less color deviation and illumination deviation than the refraction-type light-emitting device package, but may have a narrow illumination distribution area. That is, in the Comparative Examples, the refraction-type light-emitting device package may have a wider illumination distribution area than the reflection-type light-emitting device package, but may cause color deviation and illumination deviation.

In order to solve the problems of the reflection-type and refraction-type light-emitting device packages of the respective Comparative Examples, the light-emitting device package 100 may be configured such that the lens 140 may reflect and refract light emitted from the light-emitting device 120. Thus, the light-emitting device package 100 may have a wider illumination distribution area than the reflection-type light-emitting device package of the Comparative Example and may have less color deviation and illumination deviation than the refraction-type light-emitting device package of the other Comparative Example.

Referring to FIG. 1, the reflection-type and refraction-type light-emitting device package 100 according to an embodiment may have a wider illumination distribution area than the reflection-type light-emitting device package of the Comparative Example and less color deviation and illumination deviation than the refraction-type light-emitting device package of the other Comparative Example. Illumination distribution may increase when a vertical distance T1 from the lowermost apex AP of the recess RE to a virtual reference surface RS that extends from an outermost upper surface 112 of the body B increases. The extent of increase in the illumination distribution may be increased by an effect of a curvature. The vertical distance T1 may be within a range from 0.37 mm to 0.57 mm, for example, 0.47 mm.

In addition, a height H from the virtual reference surface RS that extends from the outermost upper surface 112 of the body 110 to an uppermost surface 142 of the lens 140 may be within a range from 0.81 mm to 1.11 mm, for example, 0.96 mm. The uppermost surface 142 may be located in the top portion T. Thus, a vertical height from the virtual reference surface RS that extends from the outermost upper surface 112 of the body 110 to the top portion T may be within a range from 0.81 mm to 1.11 mm.

A depth D of the recess RE may be calculated by subtracting the vertical distance T1 from the height H, and may be within a range from 0.44 mm to 0.74 mm, for example, 0.49 mm, In addition, the recess RE may be located between positions x1 and x2, which may be spaced apart from the center, or x=0, of the optical axis LX by second prescribed distances d21 and d22. The second prescribed distances d21 and d22 may be represented by the following equation 1, The distance d21 and the distance d22 may be the same.

$$d2 = \frac{L}{4}$$ Equation 1 where d2 may be each of the second prescribed distances d21 and d22, and L may be an overall width of the lens 140 and may be represented by the following equation 2.

$$L=L1+2XL2$$ Equation 2 where L1 may be a width of the body B, and L2 may be a protruding length of the protrusion F. For example, L1 may be 2.8 mm, L2 may be 0.1 mm, and L may be 3.0 mm.

When the overall width L of the lens 140 is 3 mm, the recess RE may be located between positions, x=0.75, which may be spaced apart from the center, x=0, of the lens 140 by 0.75 mm. That is, x1 may be −0.75 and x2 may be 0.75. The top portion T of the lens 140 may be spaced apart from the optical axis LX, x=0, by the second prescribed distance d2 represented by Equation 1. Thus, the top portion T may be spaced apart from the center, x=0, of the lens 140 by 0.75 mm or more.

When a first radius of curvature R1 of the recess RE increases, a proportion of light reflected into the lens 140 may increase, thus causing a reduction in illumination distribution, color deviation and illumination deviation. Conversely, when the first radius of curvature R1 of the recess RE decreases, the proportion of light reflected into the lens 140 may decrease, thus causing an increase in illumination distribution, color deviation and illumination deviation. When the first radius of curvature R1 is flat, for example, is greater than 5.5 mm, illumination distribution may decrease to 62 mm, and color deviation may decrease by 3% or less. In order to minimize color deviation and illumination deviation while widening illumination distribution as broadly as possible, the first radius of curvature R1 of the recess RE may be within a range from 1.0 mm to 5.5 mm, for example, 1.5 mm.

A second radius of curvature R2 of the edge portion E may be determined by an injection molding process for manufacturing the lens 140. For example, the second radius of curvature R2 of the edge portion E may be within a range from 0.1 mm to 0.5 mm, for example, 0.1 mm. The side portion S may be inclined by an inclination angle θ of 10° in relation to the vertical line VL parallel to the optical axis LX. When the inclination angle θ is below 10°, improvement in illumination distribution may be tenuous. When the inclination angle θ is above 10°, illumination distribution may be reduced.

Color deviation, illumination deviation, and illumination distribution of a lighting apparatus 200 in accordance with an embodiment, which includes the light-emitting device package 100 having features described above, may hereinafter be described with reference to accompanying drawings and in comparison with the reflection-type light-emitting device package of the Comparative Example and the refraction-type light-emitting device package of the other Comparative Example.

Figure 4:
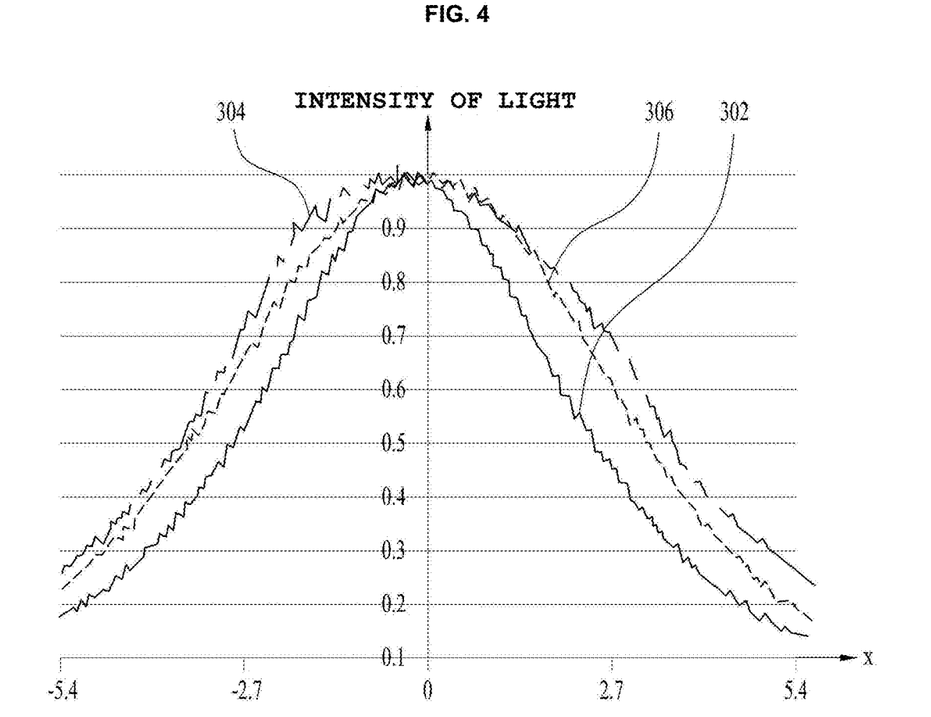
FIG. 4 is a graph illustrating intensity of light at full widths at half maximum of light-emitting device packages according to an embodiment and Comparative Examples.
Figure 7A:
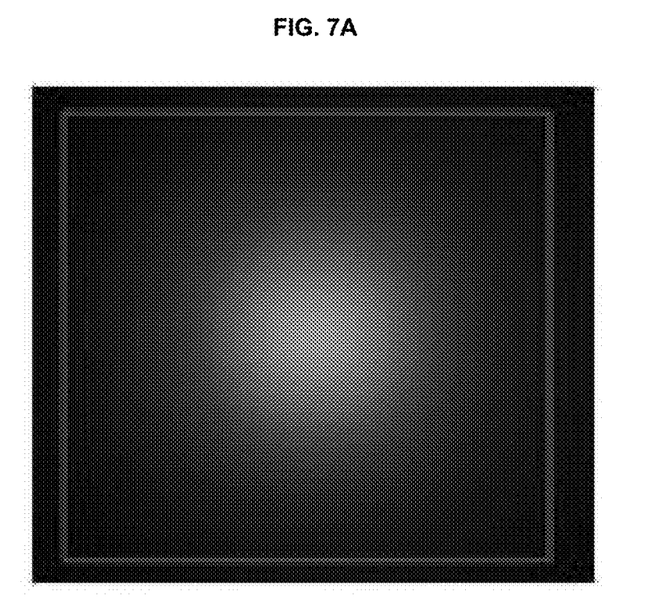
FIGS. 7A and 7B are views respectively illustrating a plan image and a viewing angle distribution of the light-emitting device package according to an embodiment.
Figure 7B:
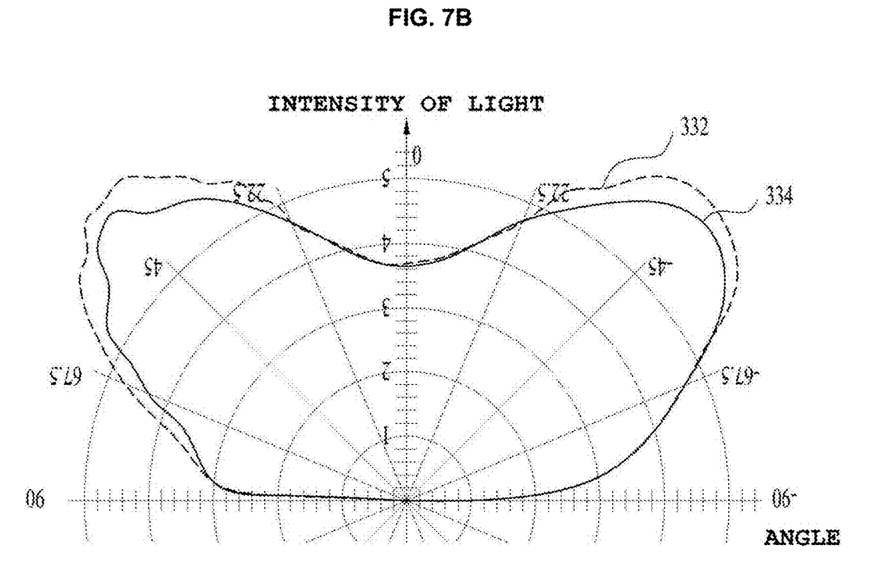

For FIGS. 4, 7A, and 7B, the light-emitting device 120 according to an embodiment having a horizontal length of 1050 mm and a vertical length of 580 mm was used. The viewing angle was measured, as the optical member 220 is spaced apart from the light-emitting device package 100 by the first prescribed distance dl of 40 mm, because the viewing angle of the lens 140, which may be required in order to know the illumination distribution thereof, may have various circular and heart shapes. In addition, color deviation and a full width at half maximum (FWHM) were measured at two points P1 and P2 on the optical member 220, as illustrated in FIG. 3. The first point P1 may be a point spaced apart from the optical axis LX in a negative direction along the x-axis by a third prescribed distance d3, and the second point P2 may be a point spaced apart from the optical axis LX in a positive direction along the x-axis by a fourth prescribed distance d4. The third and fourth prescribed distances d3 and d4 were each set to 2.7 mm. The illumination distribution may be known via the FWHM and the viewing angle.

FIG. 4 is a graph illustrating intensity of light at full widths at half maximum of the light-emitting device packages according to an embodiment and Comparative Examples. The horizontal axis represents a distance along the x-axis corresponding to a width direction, and the vertical axis represents a normalized intensity of light. Referring to FIG. 4, the FWHM 306 of the light-emitting device package 100 according to an embodiment is greater than the FWHM 302 of the reflection-type light-emitting device package of one Comparative Example and smaller than the FWHM 304 of the refraction-type light-emitting device package of the other Comparative Example. Thus, an illumination distribution area of the light-emitting device package 100 according to an embodiment may be wider than a illumination distribution area of the reflection-type light-emitting device package of one Comparative Example, but may be narrower than an illumination distribution area of the refraction-type light-emitting device package of the other Comparative Example.

For example, in FIG. 4, the FWHM of the refraction-type light-emitting device package of the Comparative Example measured at the optical member 220 is 81 mm and the FWHM of the reflection-type light-emitting device package of the other Comparative Example is 52 mm, whereas the FWHM of the light-emitting device package according to an embodiment may be within a range from 63 mm to 73 mm, for example, 68 mm.

Figure 5A:
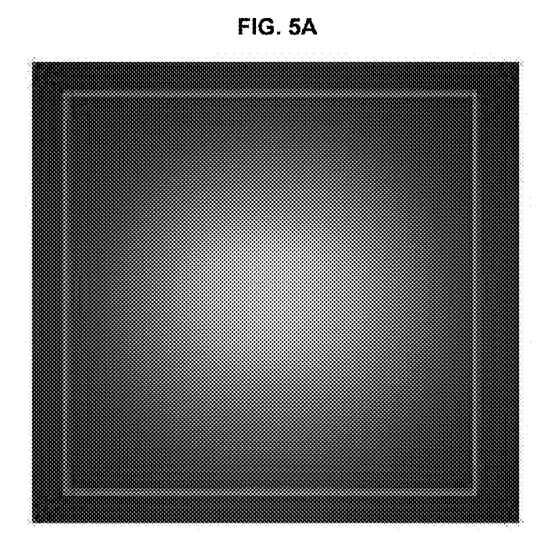
FIGS. 5A and 5B are views respectively illustrating a plan image and a viewing angle distribution of a refraction-type light-emitting device package of a Comparative Example.
Figure 5B:
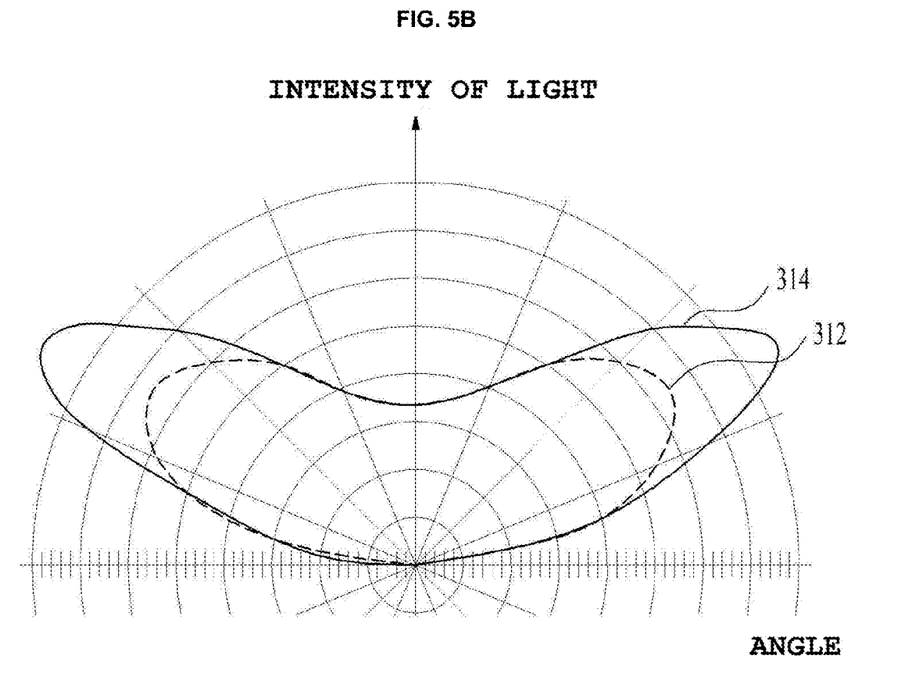
Figure 6A:
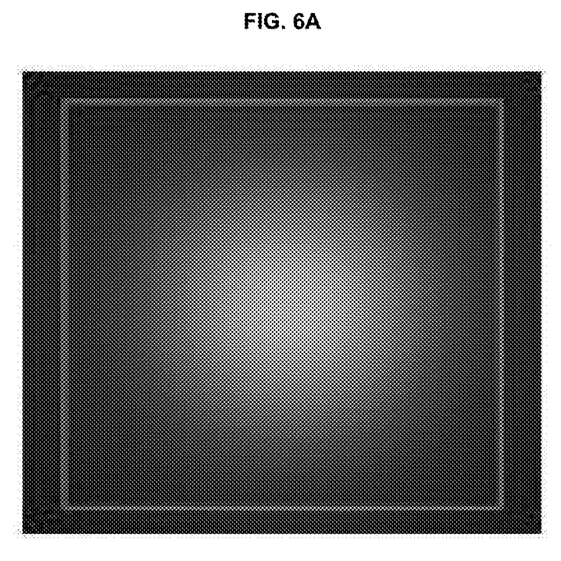
FIGS. 6A and 6B are views respectively illustrating a plan image and a viewing angle distribution of a reflection-type light-emitting device package of another Comparative Example.
Figure 6B:
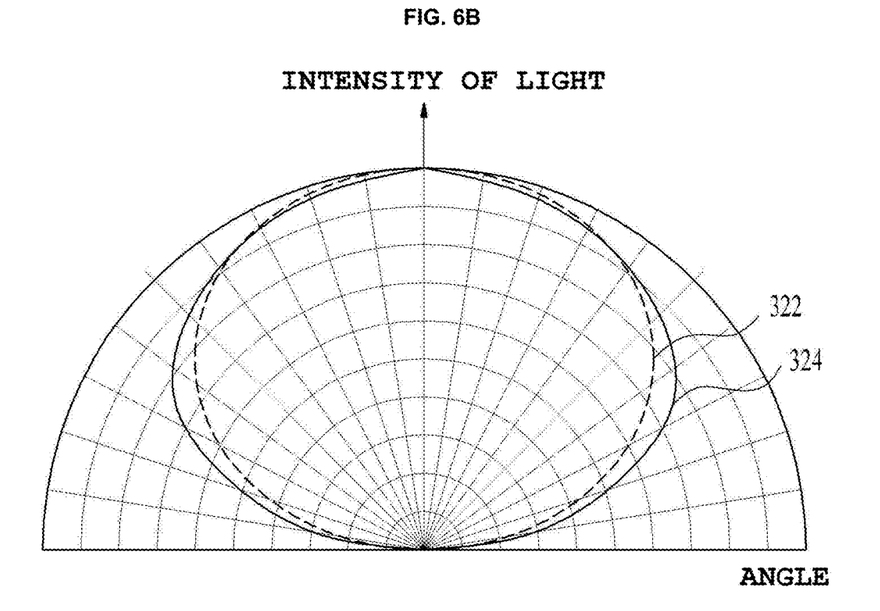

FIGS. 5A and 5B are views respectively illustrating a plan image and a viewing angle distribution of the refraction-type light-emitting device package of the Comparative Example. FIGS. 6A and 6B are views respectively illustrating a plan image and a viewing angle distribution of the reflection-type light-emitting device package of the other Comparative Example. FIGS. 7A and 7B are views respectively illustrating a plan image and a viewing angle distribution of the light-emitting device package according to an embodiment. Comparing a light emission image of the light-emitting device package according to an embodiment illustrated in FIG. 7A with light emission images 5A and 6A, the illumination distribution area in FIG. 7A is narrower than that of the refraction-type light-emitting device package of the Comparative Example illustrated in FIG. 5A, but is wider than that of reflection-type light-emitting device package of the other Comparative Example illustrated in FIG. 6A.

In the respective graphs illustrated in FIGS. 5B, 6B and 7B, the horizontal axis represents an angle and the vertical axis represents an intensity of light. Each of FIGS. 5B, 6B and 7B illustrate viewing angle distributions 312, 322 and 332, respectively, along the major axis of the light-emitting devices and viewing angle distributions 314, 324 and 334, respectively, along the minor axis of the light-emitting devices.

The illumination deviation, or illumination uniformity, along the major axis 332 and the minor axis 334 of the light-emitting device package 100 according to an embodiment illustrated in FIG. 7B is greater than the illumination uniformity along the major axis 312 and the minor axis 314 of the refraction-type light-emitting device package of Comparative Example illustrated in FIG. 5B. The illumination uniformity of the light-emitting device package according to an embodiment may have a very high value of 97%.

In FIG. 5A, the color deviation of the refraction-type light-emitting device package of the Comparative Example is about 14%, and, in FIG. 6A, the color deviation of the reflection-type light-emitting device package of the other Comparative Example is about 3%. In FIG. 7A, the color deviation measured at the optical member 220 between the center, x=0, of the light-emitting device package 100 and the points P1 and P2, which are spaced apart from the center by 2.7 mm, is within a range from 4% to 5%, for example, about 4%. A percentage value of the color deviation may be defined as a proportional variation in color temperature. For example, when color temperature is 3000K and the color deviation is 3%, a color deviation of 90K occurs.

As described above, the color deviation of the light-emitting device package according to an embodiment is smaller than the color deviation of the refraction-type light-emitting device package of the Comparative Example and greater than the color deviation of the reflection-type light-emitting device package of the other Comparative Example, That is, the color deviation of the light-emitting device package 100 according to an embodiment illustrated in FIG. 7A is smaller than the color deviation of the emission image of the light-emitting device package of Comparative Example illustrated in FIG. 5A.

The light-emitting device package according to an embodiment may have less color deviation and illumination deviation compared to the refraction-type light-emitting device package of the Comparative Example, The light-emitting device package according to an embodiment may have a higher viewing angle compared to the reflection-type light-emitting device package of the other Comparative Example, and thus, a wider light spreading area, or a wider illumination distribution area, than that of the other Comparative Example, Therefore, the light-emitting device package according to an embodiment may have an advantage of wide illumination distribution provided by the refraction-type light-emitting device package of the Comparative Example and an advantage of small illumination deviation and color deviation provided by the reflection-type light-emitting device package of the other Comparative Example. That is, the light-emitting device package according to an embodiment may increase the illumination distribution area by increasing the viewing angle as large as possible and may reduce color deviation and illumination deviation.

As the light-emitting device package 100 according to an embodiment has a high viewing angle, the first prescribed distance d1, illustrated in FIG. 3, may be reduced, which may provide the lighting apparatus 200 with an improved slim design. In addition, the light-emitting device package 100 having a high viewing angle may reduce a number of light-emitting devices 120 compared to the reflection-type light-emitting device package of the other Comparative Example, which may emit a same amount of light, thereby achieving price competitiveness thanks to reduced manufacturing costs. In the light-emitting device package 100, the lens 140 and the light-emitting device 120 may be integrally formed with each other. As such, the light-emitting device package 100 may achieve increased luminance efficacy compared to if the lens 140 and the light-emitting device 120 are spaced apart from each other.

According to embodiments disclosed herein, a light-emitting device package and a lighting apparatus including the same may achieve less color deviation and illumination deviation than a refraction-type light-emitting device package as well as a wider illumination distribution area than a reflection-type light-emitting device package, due to the light-emitting device package emitting light by refracting and reflecting light. Embodiments disclosed herein provide a light-emitting device package that may reduce color deviation and luminance deviation while increasing luminance distribution area as large as possible, and a lighting apparatus including the package.

According to embodiments disclosed herein, a light-emitting device package may include a body, a light-emitting device provided on the body, a phosphor layer provided on the body and the light-emitting device, and a lens provided on the phosphor layer to emit light by refracting and reflecting light discharged from the light-emitting device and having a lens body. The lens body may include a side portion, a recess located or provided in or at the center of an upper surface of the lens body, the recess having a curved surface, and an edge portion located or provided between the recess and the side portion, the edge portion having a convex rounded shape.

The lens body may further include a top portion located or provided between the edge portion and the recess. The lens may further include a protrusion configured to protrude from the side portion in a direction perpendicular to an optical axis.

The phosphor layer may be provided over an entire upper surface of the body and over an upper surface and a side surface of the light-emitting device. The lens may have a same planar area as the phosphor layer in a direction perpendicular to an optical axis. The light-emitting device may have different horizontal and vertical lengths in the direction perpendicular to the optical axis. The recess may be symmetrical about the optical axis, and may be thinnest at the optical axis.

A vertical distance between a lowermost apex of the recess and a virtual reference surface that extends from an outermost upper surface of the body may be within a range from 0.37 mm to 0.57 mm. The recess may have a depth within a range from 0.44 mm to 0.74 mm. The recess may be located in a region defined by points spaced apart from an optical axis by a distance L/4, where L is a width of the lens. The recess may have a radius of curvature within a range from 1.0 mm to 5.5 mm. A height from a virtual reference surface that extends from an outermost upper surface of the body to an uppermost surface of the lens may be within a range from 0.81 mm to 1.11 mm. A height from a virtual reference surface that extends from an outermost upper surface of the body to the top portion may be within a range from 0.81 mm to 1.11 mm. The top portion of the lens may be spaced apart from an optical axis by L/4, where L is a width of the lens. The value of L may be 2.8 mm. The edge portion may have a radius of curvature within a range from 0.1 mm to 0.5 mm. The side portion may be inclined by 10° in relation to a vertical line parallel to an optical axis, The light-emitting device package may further include first and second lead frames spaced apart from each other in a width direction of the lens. The light-emitting device may include a first conductive semiconductor layer, an active layer, and a second conductive semiconductor layer. The first and second conductive semiconductor layers may be electrically connected to the first and second lead frames respectively.

According to embodiments disclosed herein, a lighting apparatus may include the light-emitting device package described above, and an optical member provided above the light-emitting device package. A distance between the optical member and the lens may be 40 mm. A full width at half maximum of the light-emitting device package measured at the optical member may be within a range from 63 mm to 73 mm. Color deviation between a center of the light-emitting device package and a point spaced apart from the center by 2.7 mm in a direction perpendicular to an optical axis, measured at the optical member, may be within a range from 4% to 5%.

It will be understood that, when each element is referred to as being formed "on" or "under" the other element, it can be directly "on" or "under" the other element or be indirectly formed with one or more intervening elements therebetween. In addition, it will be understood that "on" or "under" the element may mean an upward direction and a downward direction of the element. The relative terms "first", "second", "top/upper/above", "bottom/lower/under" and the like in the description and in the claims may be used to distinguish between any one substance or element and other substances or elements and not necessarily for describing any physical or logical relationship between the substances or elements or a particular order.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed s:

1. A lighting apparatus, comprising:
a light-emitting device package; and
an optical member provided above the light-emitting device package,
wherein the light-emitting device package comprises:
a body;
a light-emitting device provided on the body;
a phosphor layer provided on the body and the light-emitting device; and
a lens provided on the phosphor layer that refracts and reflects light discharged from the light-emitting device and having a lens body, wherein the lens body includes:
a side portion;
a recess having a curved surface and provided at a center of an upper surface of the lens body; and
an edge portion having a convex rounded shape and provided between the recess and the side portion,
wherein the lens has a same planar area as a planar area of the phosphor layer in a direction perpendicular to an optical axis, and
wherein a full width at half maximum of the light-emitting device package measured at the optical member is within a range from 63 mm to 73 mm.

2. The apparatus according to claim 1, wherein the lens further includes a protrusion configured to protrude from the side portion in a direction perpendicular to an optical axis.

3. The apparatus according to claim 1, wherein the recess is symmetrical about an optical axis.

4. The apparatus according to claim 1, wherein the lens is thinnest at an optical axis.

5. The apparatus according to claim 1, wherein a vertical distance between a lowermost apex of the recess and a virtual reference surface that extends from an outermost upper surface of the body is within a range from 0.37 mm to 0.57 mm.

6. The apparatus according to claim 1, wherein the recess has a depth within a range from 0.44 mm to 0.74 mm.

7. The apparatus according to claim 1, wherein the recess is provided in a region defined by points spaced apart from an optical axis by a distance L/4, where L is a width of the lens.

8. The apparatus according to claim 1, wherein the recess has a radius of curvature within a range from 1.0 mm to 5.5 mm.

9. The apparatus according to claim 1, wherein a height from a virtual reference surface that extends from an outermost upper surface of the body to an uppermost surface of the lens is within a range from 0.81 mm to 1.11 mm.

10. The apparatus according to claim 1, wherein the edge portion has a radius of curvature within a range from 0.1 mm to 0.5 mm.

11. The apparatus according to claim 1, wherein the side portion is inclined by 10° in relation to a vertical line parallel to an optical axis.

12. The apparatus according to claim 1, further including first and second lead frames spaced apart from each other in a width direction of the lens,
wherein the light-emitting device includes a first conductive semiconductor layer, an active layer, and a second conductive semiconductor layer, and
wherein the first and second conductive semiconductor layers are electrically connected to the first and second lead frames, respectively.

13. The apparatus according to claim 1, wherein a distance between the optical member and the lens is 40 mm.

14. The apparatus according to claim 1, wherein color deviation between a center of the light-emitting device package and a point spaced apart from the center by 2.7 mm in a direction perpendicular to an optical axis, measured at the optical member, is within a range from 4% to 5%.

15. The apparatus according to claim 1, wherein the lens body further includes a top portion provided between the edge portion and the recess.

16. The apparatus according to claim 15, wherein a height from a virtual reference surface that extends from an outermost upper surface of the body to the top portion is within a range from 0.81 mm to 1.11 mm.

17. The apparatus according to claim 15, wherein the top portion of the lens is spaced apart from an optical axis by L/4, where L is a width of the lens.

* * * * *